United States Patent [19]
Hackman et al.

[11] Patent Number: 5,373,259
[45] Date of Patent: Dec. 13, 1994

[54] VOLTAGE CONTROLLED OSCILLATOR WITH DISSIMILAR VARACTOR DIODES

[75] Inventors: Scott Hackman, Carlsbad; Anthony J. Estrada, San Diego, both of Calif.

[73] Assignee: Qualcomm Incorporated, San Diego, Calif.

[21] Appl. No.: 57,028

[22] Filed: May 5, 1993

[51] Int. Cl.⁵ ............... H03B 5/18; H03L 7/099
[52] U.S. Cl. ............... 331/36 C; 331/117 D; 331/177 V; 331/25
[58] Field of Search ........... 331/36 R, 36 C, 108 R, 331/116 R, 116 PE, 117 R, 117 FE, 117 D, 177 V, 25; 333/235

[56] References Cited

U.S. PATENT DOCUMENTS

| | | | |
|---|---|---|---|
| 3,784,917 | 1/1974 | Kenyon | 331/36 C X |
| 4,123,726 | 10/1978 | Schucht | 331/36 C X |
| 4,546,329 | 10/1985 | Unger | 331/16 |
| 4,564,815 | 1/1986 | Naito | 331/36 C X |
| 5,081,429 | 1/1992 | Atriss et al. | 331/57 |
| 5,097,228 | 3/1992 | McJunkin | 331/176 |

FOREIGN PATENT DOCUMENTS 0387745  9/1990  European Pat. Off. ........ 331/177 V

*Primary Examiner*—David Mis
*Attorney, Agent, or Firm*—Russell B. Miller; Katherine W. White

[57] ABSTRACT

A voltage controlled oscillator comprises more than one dissimilar diode. The dissimilar diodes have different capacitance versus voltage characteristic shapes. The dissimilarity causes the tuning gain factor of the resulting oscillator to be an increasing function of increasing frequency. Such an oscillator when properly incorporated into a phase lock loop can yield loop parameters which are a constant function of increasing frequency.

7 Claims, 4 Drawing Sheets

VOLTAGE CONTROLLED OSCILLATOR WITH DISSIMILAR VARACTOR DIODES

BACKGROUND OF THE INVENTION

I. Field of the Invention

The present invention relates to oscillator circuits, and more particularly relates to oscillator circuits that tune over a range of frequencies with an increasing tuning gain factor as a function of increasing frequency.

II. Description of the Related Art

A phase lock loop requires an oscillator wherein the frequency of oscillation of the oscillator is controllable. A typical circuit for performing such a function is comprised of an amplifier and a resonant tank. The resulting circuit has a frequency where the gain is greater than unity and the phase is equal to zero. This frequency is the frequency of oscillation as set by the resonant tank. The relationship is most easily seen on a Bode diagram. FIG. 1 illustrates a Bode diagram for a typical oscillator. Curve 10 is representative of the gain in decibels of the oscillator as referenced to the left vertical axis and Curve 20 is representative of the phase in degrees as referenced to the right vertical axis. As indicated by Point 30, the oscillation occurs when the oscillator gain in approximately 14 dB and the phase is zero producing an oscillation at approximately 124 MHz. In general the resonant tank is comprised of at least one variable component wherein the reactance of the variable component is a function of a control signal, typically a voltage level, so that the frequency of zero phase, and consequently the frequency of oscillation, is also variable.

FIG. 2 illustrates in graphical form a standard frequency versus control signal graph. Curve 50, as referenced to the left vertical axis, represents the frequency response of the oscillator circuit in MegaHertz (MHz) to the control signal in Volts (V). A portion of the Curve 50, corresponding a control signal level between 4 and 10 Volts, is approximately linear. Line 60 is shown for reference purposes and represents a linear approximation of the control voltage from 4 to 10 Volts. If Curve 50 is mathematically differentiated with respect to the control signal, the result is the oscillator sensitivity or gain factor, $K_V$, typically having the units Hz/Volt. Curve 70 represents $K_V$ for the oscillator of FIG. 2 as referenced to the right vertical axis. Curve 70 is typical of standard oscillators in that it is a decreasing function of increasing control voltage and frequency.

When the oscillator circuit described above is included in a phaselock loop circuit, oscillator gain factor, $K_V$, is one of the factors which determines the behavior of the loop. FIG. 3 represents a block diagram of a typical phaselock loop. Voltage controlled oscillator (VCO)120 is an oscillator circuit wherein the frequency of the output signal increases with increasing applied voltage with a gain factor of $K_V$. When the VCO gain is transferred into the s-domain, it becomes $K_V/S$ with the s in the denominator indicating that the VCO acts as an integrator of phase error. The output of VCO 120 is divided down to a lower frequency by divider 130 defined by:

$$F_{DIV} = \frac{F_{VCO}}{N} \tag{1}$$

where:

$F_{DIV}$ is the frequency of the output of divider 130;

$F_{VCO}$ is the frequency of the output of VCO 120; and

N is the integer division ratio provided by divider 130.

The output of divider 130 with phase $\phi_O$ is coupled to phase/frequency detector (PD) 100. PD 100 compares $\phi_O$ to the phase of a reference input, $\phi_I$, and produces an output error signal proportional to the phase difference of its two inputs. The gain of PD 100 is $K_D$ having the units Volts/radian. Loop filter 110 filters the output of PD 100 and has the s-domain transfer function F(s). The output of loop filter 110 is applied to the control terminal of VCO 120.

The divider of a typical phase lock is programmable and provides the frequency selection of the output. To illustrate the frequency control of the loop, assume that the loop is closed meaning that the frequency of the output, $F_{VCO}$, is exactly N times the reference input frequency ($F_{REF}$). Consider the reaction of the loop if the value of N is decreased. Initially the frequency from divider 130 increases and the two inputs to PD 100 are no longer in phase. The error signal from PD 100 reflects the magnitude of the phase difference. The output of loop filter 110 decreases causing the output frequency of VCO 120 to also decrease. This mechanism continues until the two inputs of PD 100 are again in phase. The result is that the loop is "locked" at a lower frequency.

The manner in which the loop becomes and stays locked is set by the open-loop transfer function, G(s), of the phaselock loop circuit and is mathematically is defined by:

$$G(s) = \frac{2\pi K_V K_D F(s)}{Ns} \tag{2}$$

where all the variables are as define above. The closed-loop transfer function follows directly from the open-loop transfer function and is defined by:

$$H(s) = \frac{NG(s)}{1 + G(s)}. \tag{3}$$

The open-loop and closed-loop transfer functions determine many important characteristics of the loop including stability, damping factor, settling time, and phase noise.

The problem of such a phase-lock loop is both N and $K_V$ are functions of the loop output frequency. N increases in value to directly increase the phaselock loop output and $K_V$ decreases with increasing VCO frequency when using a standard oscillation circuit with the characteristics previously described. The open-loop transfer function, being proportional to $K_V/N$, is consequently also a decreasing function of output frequency directly rendering the loop characteristics dependent on the output frequency.

The present invention discloses a dissimilar varactor diode principle voltage controlled oscillator (DDPO) wherein $K_V$ is an increasing function of oscillation frequency. In a circuit where the required set of output frequencies covers a significant range and the loop characteristics are critical, the effects of decreasing open-loop and closed-loop transfer functions could render some more difficult designs unable to be actualized with standard oscillators. However by employing a DDPO, these more difficult designs are realizable.

It is therefore the objective of the present invention to provide a novel and improved apparatus and method for implementing a voltage controlled oscillator wherein the gain factor of the oscillator, $K_V$, is an increasing function of increasing frequency.

SUMMARY OF THE INVENTION

The present invention is a novel and improved apparatus and method for implementing a voltage control oscillator (VCO). The oscillator has the property that gain factor is an increasing function of frequency over some range of control voltage. When the present invention is employed in a properly designed phaselock loop, the loop characteristics are very stable over frequency.

In accordance with the present invention, circuitry creating a VCO wherein tuning gain is an increasing function of frequency is disclosed. The circuitry is comprised of an amplification means and a controllable resonance means. These two elements are coupled together in manner which produces an oscillation wherein the frequency of the oscillation is a function of a control signal. The improvement of the present invention is a function of the implementation of the resonance means. The resonance means is comprised of at least two dissimilar varactor diodes providing frequency control wherein the gain factor is increasing as a function of increasing frequency.

BRIEF DESCRIPTION OF THE DRAWINGS

The features, Objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

A phase lock loop requires an oscillator wherein the frequency of oscillation of the oscillator is controllable. A typical circuit for performing such a function is comprised of an amplifier and a resonant tank. The resonant tank is typically comprised of an inductor or other element with a positive reactance and a capacitive element. If an ideal oscillator is comprised of a resonant tank having an ideal inductor and an ideal capacitor, the frequency of oscillation of the oscillator as set by the resonate tank is defined by:

$$2\pi F_{OSC} = \frac{1}{\sqrt{LC}} \quad (4)$$

where:
$F_{OSC}$ is the frequency of the oscillation in Hz;
L is the value of the inductor in H; and
C is the value of the capacitor in F.

The most common controllable oscillator comprises a varactor diode as the capacitive element. A varactor diode is a diode having a capacitance which is a function of reverse voltage. The voltage variable capacitance provides the desired control mechanism for the resonant tank and in turn provides the frequency control of the output signal of the oscillator.

An ideal varactor diode has a capacitance as a function of reverse voltage defined by:

$$C(v) = \frac{C_O}{\left(1 + \frac{v}{\phi}\right)^\gamma} \quad (5)$$

where:
$C_O$ is the capacitance at zero Volts in Farads;
v is the reverse voltage in Volts;
$\phi$ is the junction potential in Volts (0.7 V for silicon); and
$\gamma$ is the capacitive exponent.

Equations 4 and 5 are combined to yield an equation giving frequency as a function of applied voltage defined by:

$$2\pi F_{OSC}(v) = \frac{1}{\sqrt{L \dfrac{C_O}{\left(1 + \frac{v}{\phi}\right)^\gamma}}} \quad (6)$$

The gain factor, $K_V$, of an oscillator is the rate of change of the frequency at the output of the oscillator as a function of applied voltage and typically has units of Hz/Volt. $K_V$ can be mathematically determined by differentiating the equation for output frequency with respect to the control voltage. In this case, Equation 6 is differentiated with respect to v resulting in the gain factor, $K_V$, of the oscillator as defined by:

$$K_V = \frac{\gamma \left(1 + \frac{v}{\phi}\right)^{\frac{\gamma}{2} - 1}}{4\pi\phi \sqrt{LC_O}}. \quad (7)$$

Examination of Equation 7 reveals several notable facts about the value of $K_V$ as a function of $\gamma$. If $\gamma$ is equal to 2 then $K_V$ is a flat function of control voltage and frequency since the term $$\left(1 + \frac{v}{\phi}\right)$$

is raised to the zero power. If $\gamma$ is less than two then $K_V$ is a decreasing function of frequency and if $\gamma$ is more than two then $K_V$ is an increasing function of frequency. In reality $\gamma$ is not a constant and seldom greater than 2.

Actual varactor diodes have curves which do not strictly follow Equation 5 and consequently $K_V$ does not follow Equation 7.

Figure 1:
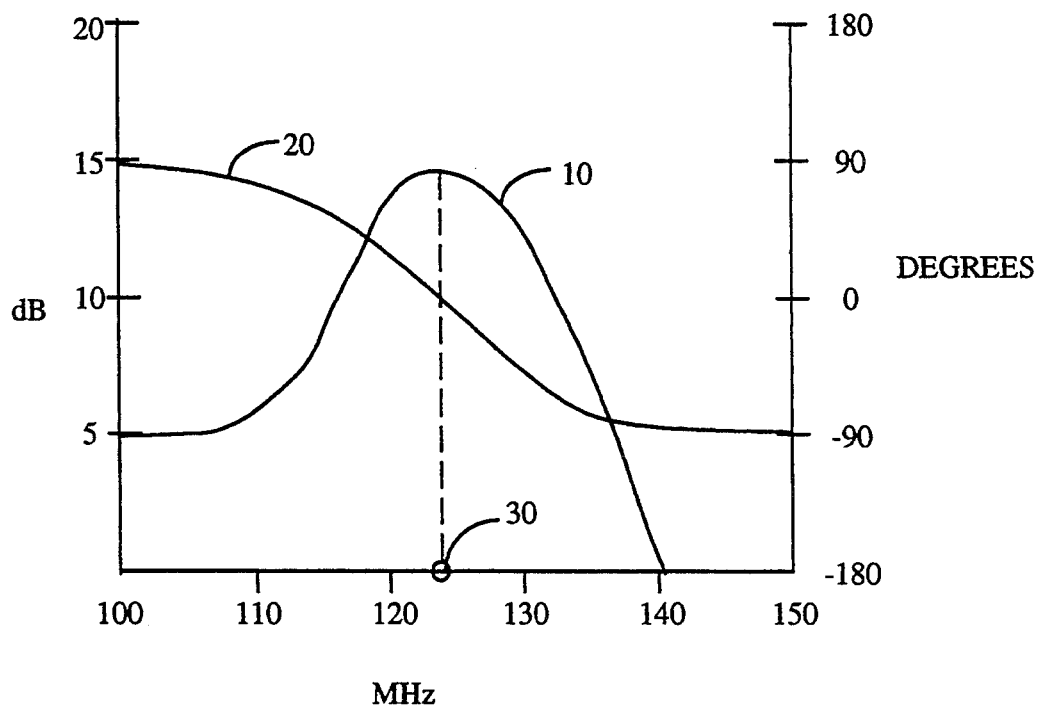
FIG. 1 is a Bode diagram of a typical oscillator.
Figure 2:
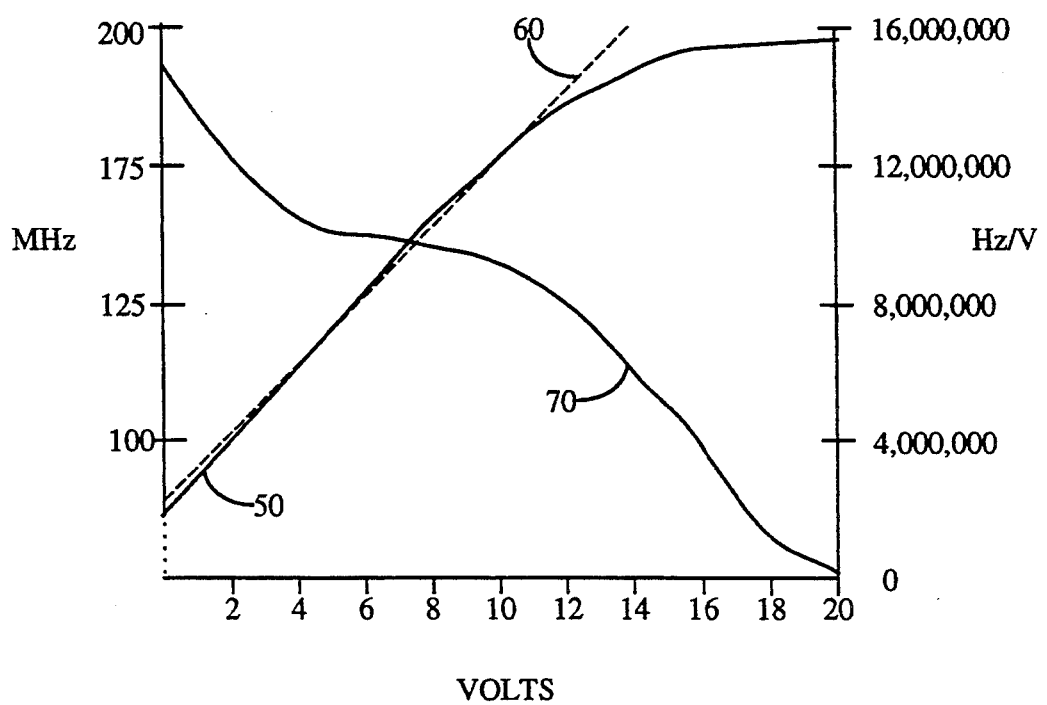
FIG. 2 illustrates the tuning gain factor versus frequency of a typical oscillator.
Figure 3:
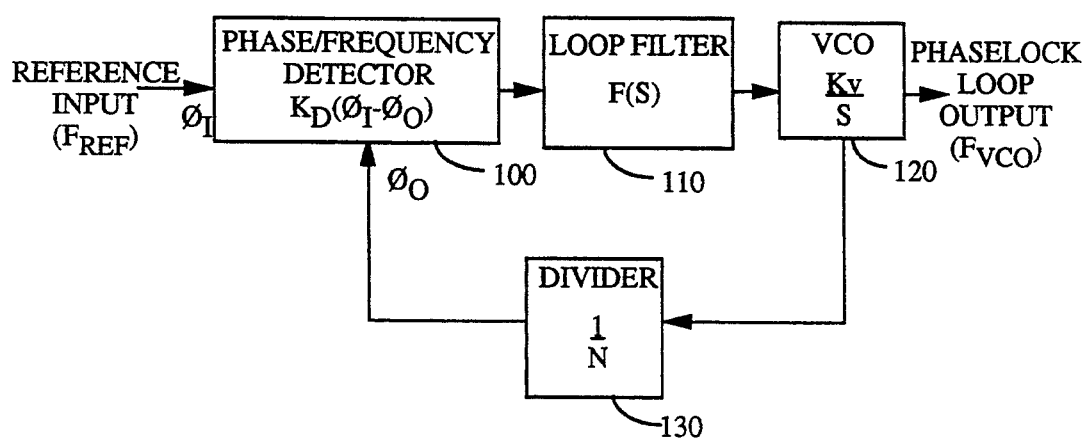
FIG. 3 is a block diagram illustrating an exemplary configuration for a phaselock loop.
Figure 4:
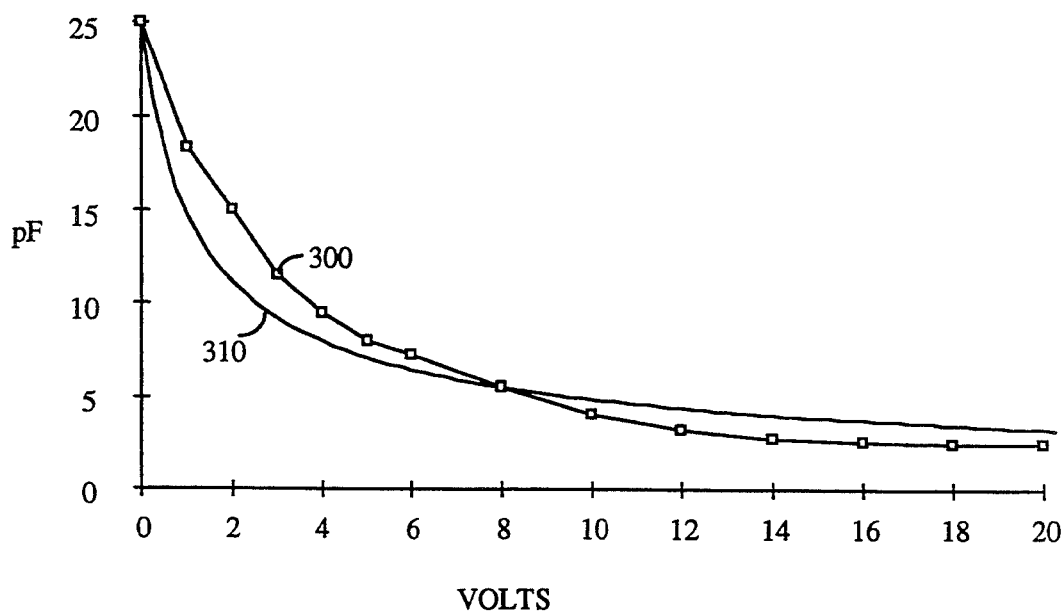
FIG. 4 illustrates in graphical form the characteristics of a typical varactor diode and an theoretical approximation thereto.

To illustrate the deviation of an actual varactor diode curve from the ideal varactor diode of equation 5, FIG. 4 shows a graph of an actual varactor diode characteristic and a theoretical approximation of the actual. Curve 300 is representative of the characteristics of a varactor diode sold by Alpha Industries Inc. of Woburn, Mass. under part number SMV1200-04A. Although there are no constant values of $\gamma$, $\phi$ and $C_O$ which produce a curve to match Curve 300 exactly, Curve 310 is generated by Equation 5 using constant values of $\gamma$, $\phi$, and $C_O$ which produce a curve approximating response the SMV1200-04A. Curve 310 has a different contour than Curve 300 indicating that in reality $\gamma$ takes on many values over the range of voltages shown. Therefore, a closer approximation to Curve 300 can be generated by using Equation 5 having a $\gamma$ which is a function of reverse voltage. Even though $\gamma$ of actual varactor diodes are far from an ideal constant, a great deal of insight into building an oscillator with a gain that increases with increasing frequency can be obtained by the examination of Equations 5-7.

According to Equation 7, a $\gamma$ which increases with voltage produces a $K_V$ which increases with frequency. Typical varactor diodes have a $\gamma$, which increases only over some portion of the entire range of the capacitance values as a function of voltage thereby yielding a $K_V$ which increases over a corresponding portion of the frequency range over which the associated oscillator operates. In turn, the phase lock loop incorporating the associated oscillator can yield constant loop parameters only over a subset of actual operating frequencies.

To extend the range of the increasing $K_V$, the designer can choose a design topology for an oscillator comprising more than one varactor diode. The designer then chooses at least two varactor diodes with dissimilar characteristics. This technique is contrary to previous designs in which the two varactors selected are matched in characteristics. The dissimilar varactor diodes have capacitance versus voltage curves which have different shapes caused by a dissimilarity of the $\gamma$ over voltage between the two varactor diodes. The capacitance value of the varactor diodes and relative influence of each varactor diode on the oscillation frequency affects the relative influence of the $\gamma$ of each varactor diode on the $K_V$ of the oscillator.

Generally the required operating frequency range dictates the capacitance value range of the varactor diode combination. In the example that follows, two dissimilar diodes are chosen that have similar capacitance ranges but different shape characteristics. Alternatively, two diodes could be chosen which have different shapes and values. The combination could be chosen such that a first diode dictates that output frequency over a set of control voltages where the $\gamma$ of the first diode is increasing. The combination could comprise second value varactor diode having a smaller value of capacitance that dictates the output frequency over a second set of control voltages where the $\gamma$ of the second diode is increasing.

Figure 5:
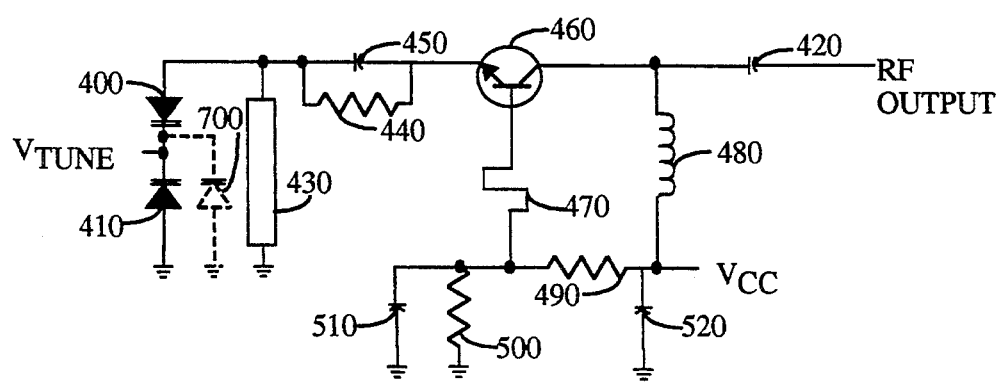
FIG. 5 is a schematic representation of a possible dual varactor diode topology for use as a dissimilar varactor diode principle voltage controlled oscillator (DDPO)

A schematic of an exemplary configuration for a multiple varactor diode oscillator is presented in FIG. 5. Transistor 460 is biased in the active region in a common base configuration. Inductor 480 provides a D.C. bias to the collector of transistor 460. Resistors 490 and 500 provide a D.C. bias to the base of transistor 460 through printed base inductor 470. Printed base inductor unstabilizes transistor 460 and causes an oscillation thereof. Capacitor 510 provides an A.C. ground to the D.C. bias of the base of transistor 460 between resistors 490 and 500 to prevent unwanted feedback. Capacitor 520 provides an A.C. ground for the D.C. supply (not shown) which provides the voltage $V_{CC}$. The emitter of transistor 460 is connected to the resonance tank through parallel coupling components capacitor 450 and resistor 440. The resonance tank comprises varactor diodes 400 and 410, and printed transmission line 430 The collector of transistor 460 provides the RF output signal of the circuit through D.C. blocking capacitor 420 at a frequency set by the resonant tank.

Figure 6:
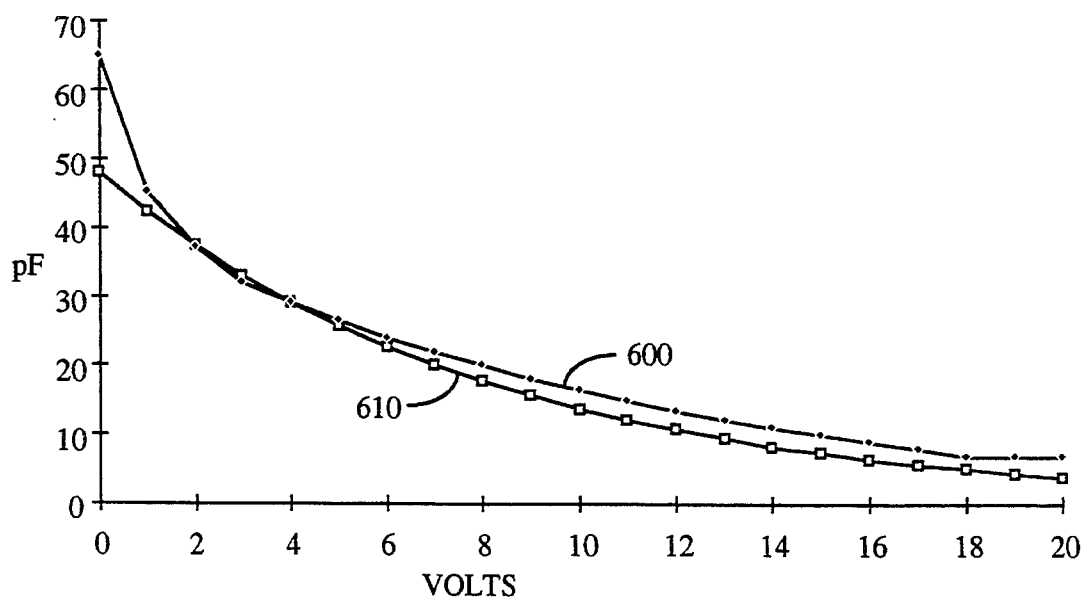
FIG. 6 is varactor diode curves for two varactor diodes employed in an experimental DDPO using the configuration of FIG. 5.

An oscillator having the structure of FIG. 5 was constructed comprising an Alpha varactor diode part number SMV1200-007 and varactor diode of Siemens Components Inc. of Iselin, N.J. sold under part number BB 439. The capacitance versus voltage curve of each varactor diode is shown in FIG. 6. Curve 600 represents the capacitance of the Alpha varactor diode and Curve 610 represents the capacitance of the Siemens varactor diode. The dissimilarity between the varactor diode curves is evidenced by the difference in Curves 600 and 610.

Figure 7:
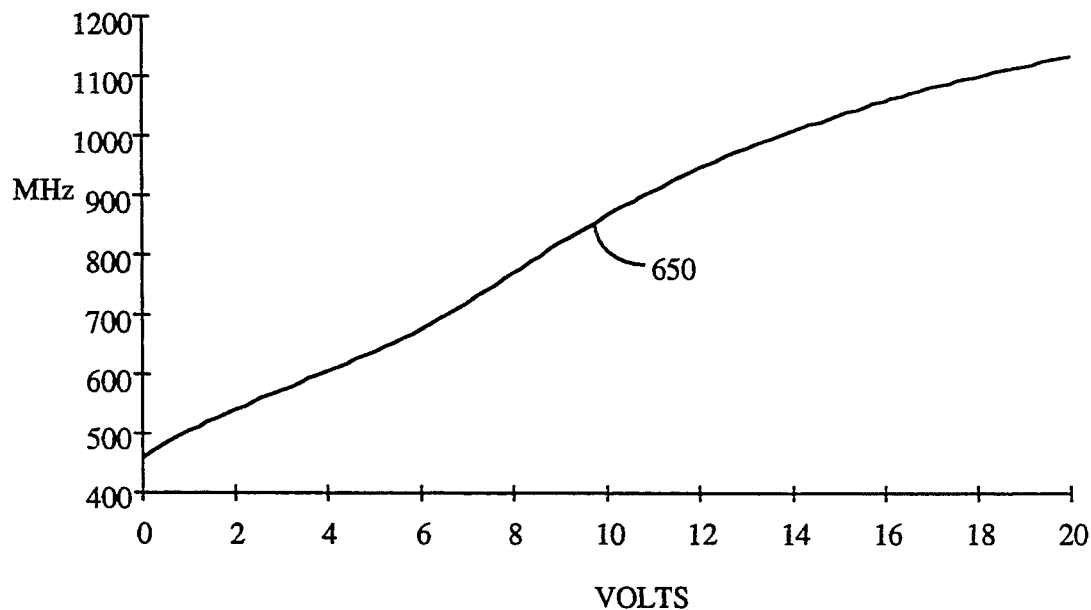
FIG. 7 is a graph of the resulting frequency versus control voltage of the experimental DDPO.

The constructed oscillator comprised of the two dissimilar varactor diodes of FIG. 6 was designed to cover the operating range of 500 MHz to 1 GHz. FIG. 7 shows the experimental results in graphical form as output frequency versus control voltage. Curve 650 is non-linear meaning that $K_V$ is not flat over frequency.

Figure 8:
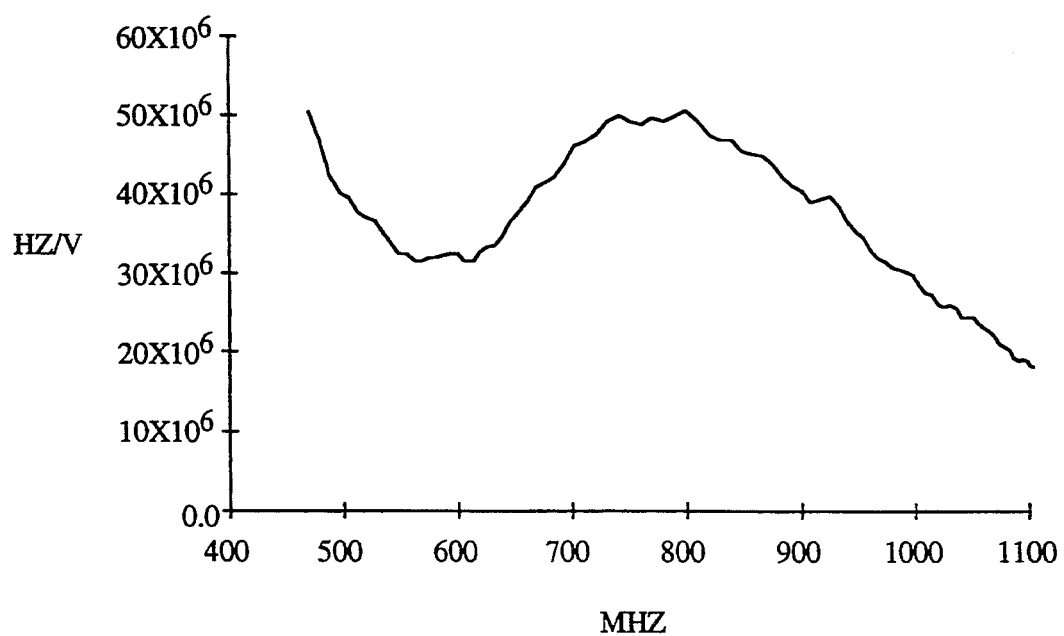
FIG. 8 is a graph of the resulting $K_V$ versus frequency curve of the experimental DDPO.

FIG. 8 shows the resulting $K_V$ versus frequency over the entire operating frequency range. FIG. 8 shows a significant range of frequencies, from 560 MHz up to 750 MHz, where $K_V$ is increasing. A properly designed phase lock loop comprising this oscillator design could have highly constant loop parameters over this operating region.

This invention is not limited to the embodiment of the forgoing example. The topology used is not limited to the common base topology. Likewise the topology of the resonant tank can be parallel as in FIG. 5 or a series configuration. Also, an oscillator comprising more than two varactor diodes could be employed to extend the range of frequencies over which $K_V$ is increasing. See, for example, varactor diode 700 shown in phantom in FIG. 5.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A voltage controlled oscillator for generating a variable frequency signal, wherein the frequency of said variable frequency signal is a function of a frequency control voltage, said function having a gain factor defined as change in frequency over change in volts, comprising:

a biased amplifier having an output terminal for providing said variable frequency signal; and a variable reactance resonant tank for setting the frequency of said variable frequency signal over a predefined range of resonant frequencies, said variable reactance having a positive reactance component and first and second varactor diodes having different capacitance versus voltage characteristics from each other, said first and second varactor diodes receiving said frequency control voltage;

wherein said capacitance versus voltage characteristic of said first varactor diode is selected such that said gain factor increases over a first subset of said predefined range of resonant frequencies and wherein said capacitance versus voltage characteristic of said second varactor diode is selected such that said gain factor increases over a second subset of said predefined range of resonant frequencies different from said first subset, thereby causing said gain factor to increase with the frequency of said variable frequency signal over said predefined range of resonant frequencies.

2. The voltage controlled oscillator of claim 1 wherein said variable reactance resonant tank further has a third varactor diode for receiving said frequency control voltage, said third varactor diode having a capacitance versus voltage characteristic different from said capacitance versus voltage characteristics of said first and second varactor diodes.

3. A phase locked loop comprising:

a voltage controlled oscillator for generating a variable frequency signal, wherein the frequency of said variable frequency, signal is a function of a frequency control voltage, said function having a gain factor defined as change in frequency over change in volts, said voltage controlled oscillator including:

a biased amplifier having an output terminal for providing said variable frequency signal, and a variable reactance resonant tank for setting the frequency of said variable frequency signal over a predefined range of resonant frequencies, said variable reactance having a positive reactance component and first and second varactor diodes having different capacitance versus voltage characteristics from each other, said first and second varactor diodes receiving said frequency control voltage, wherein said capacitance versus voltage characteristic of said first varactor diode is selected such that said gain factor increases over a first subset of said predefined range of resonant frequencies and wherein said capacitance versus voltage characteristic of said second varactor diode is selected such that said gain factor increases over a second subset of said predefined range of resonant frequencies different from said first subset thereby causing said gain factor to increase with the frequency of said variable frequency signal over said predefined range of resonant frequencies;

a divider for receiving said variable frequency signal, dividing said variable frequency signal, and producing a resultant divider output signal;

a phase detector for receiving said resultant divider output signal, comparing the phase of said resultant divider output signal to an input reference signal, and producing a phase detector output signal indicative of said comparison; and a loop filter for receiving said phase detector output signal and filtering said phase detector output signal to produce said frequency control voltage.

4. A common base voltage controlled oscillator having:

a biased bipolar junction transistor;

a resonant tank circuit operative over a predefined range of resonant frequencies and having a first varactor diode and a second varactor diode wherein said second diode has a different capacitance versus voltage curve from said first varactor diode, said first and second varactor diodes being coupled to a control voltage for setting the reactance of said first and second varactor diodes;

wherein said capacitance versus voltage characteristic of said first varactor diode is selected such that said gain factor increases over a first subset of said predefined range of resonant frequencies and wherein said capacitance versus voltage characteristic of said second varactor diode is selected such that said gain factor increases over a second subset of said predefined range of resonant frequencies different from said first subset, thereby causing said gain factor to increase with the frequency of said variable frequency signal over said predefined range of resonant frequencies;

means for coupling said resonant tank to the emitter of said biased bipolar junction transistor;

positive reactance means coupled between an A.C. ground and the base of said bipolar junction transistor; and output coupling means for coupling an oscillation signal from the collector of said biased bipolar junction transistor wherein said oscillation signal has a frequency which is a function of said control voltage and the gain factor of said function increases with increasing frequency of said oscillation signal wherein said gain factor is defined as the ratio of change in frequency of said oscillation signal to change in voltage of said control voltage.

5. A voltage controlled oscillator for generating a variable frequency signal, wherein the frequency of said variable frequency signal is a function of a frequency control voltage, said function having a gain factor defined as change in frequency over change in volts, comprising:

a biased amplifier having an output terminal for providing said variable frequency signal; and a variable reactance resonant tank for setting the frequency of said variable frequency signal over a predefined range of resonant frequencies, said variable reactance having a positive reactance component and first and second varactor diodes being respectively characterized by different first and second capacitive exponents and different first and second capacitances, said first and second varactor diodes receiving said frequency control voltage wherein said first capacitive exponent increases over a first range of said frequency control voltage and said second capacitive exponent increases over a second range of said frequency control voltage different from said first range;

wherein said first capacitance and first gain factor are selected such that said first varactor diode is determinative of said frequency of said variable frequency signal over a first subset of said predefined range of resonant frequencies, and wherein said second capacitance and second capacitive exponent are selected such that said second varactor diode is determinative of said frequency of said variable frequency signal over a second subset of said predefined range of resonant frequencies different from said first subset of resonant frequencies.

6. In a phase locked loop for providing an output signal in response to an input signal, said phase locked loop including a divider for producing a frequency-divided output signal wherein a transfer function of said divider is dependent upon an output frequency of said output signal, a voltage controlled oscillator for generating said output signal on the basis of a frequency control voltage related to phase difference between said input signal and said frequency-divided output signal, said voltage controlled oscillator being characterized by a gain factor defined as change in said output frequency over change in volts of said frequency control voltage, said voltage controlled oscillator comprising:
   a biased amplifier having an output terminal for providing said output signal; and
   a variable reactance resonant tank for setting said output frequency over a predefined range of resonant frequencies, said variable reactance having a positive reactance component and first and second varactor diodes having different capacitance versus voltage characteristics from each other, said first and second varactor diodes receiving said frequency control voltage;
   wherein said capacitances versus voltage characteristics of said first and second varactor diodes are selected such that said gain factor changes over differing first and second subsets, respectively, of said predefined range of resonant frequencies in order to compensate for said dependence of said transfer function upon said output frequency.

7. The voltage controlled oscillator of claim 5 wherein said variable reactance resonant tank further has a third varactor diode to which is coupled said frequency control voltage, said third varactor diode having a capacitance versus voltage characteristic different from said capacitance versus voltage characteristics of said first and second varactor diodes.

* * * * *